(12) United States Patent
Hong

(10) Patent No.: US 6,417,101 B2
(45) Date of Patent: Jul. 9, 2002

(54) METHOD FOR MANUFACTURING SEMICONDUCTOR MEMORY DEVICE INCORPORATING THEREIN COPACITOR

(75) Inventor: Suk-Kyoung Hong, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 7 days.

(21) Appl. No.: 09/739,384

(22) Filed: Dec. 19, 2000

(30) Foreign Application Priority Data

Dec. 28, 1999 (KR) .............................. 99-64081

(51) Int. Cl.$^7$ .......................................... H01L 21/8242
(52) U.S. Cl. ...................... 438/660; 438/240; 438/253; 438/653
(58) Field of Search ................................ 438/240, 253, 438/396, 653, 660, FOR 212

(56) References Cited

U.S. PATENT DOCUMENTS

| | | | |
|---|---|---|---|
| 5,288,665 A | * | 2/1994 | Nulman |
| 5,523,259 A | * | 6/1996 | Merchant et al. |
| 5,654,235 A | * | 8/1997 | Matsumoto et al. |
| 5,804,249 A | * | 9/1998 | Sukharev et al. |
| 5,837,591 A | * | 11/1998 | Shimada et al. |
| 5,994,213 A | * | 11/1999 | Wang et al. |
| 6,016,009 A | * | 1/2000 | Sukharev et al. |
| 6,194,746 B1 | * | 2/2001 | Gonzalez et al. |
| 6,294,468 B1 | * | 9/2001 | Gould-Choquette et al. |
| 6,313,027 B1 | * | 11/2001 | Xu et al. |
| 6,331,460 B1 | * | 12/2001 | Kizilyalli et al. |
| 6,344,411 B1 | * | 2/2002 | Yamada et al. |
| 6,346,454 B1 | * | 2/2002 | Sung et al. |

* cited by examiner

Primary Examiner—George Fourson
Assistant Examiner—Joannie Adelle Garcia
(74) Attorney, Agent, or Firm—Jacobson Holman, PLLC

(57) ABSTRACT

A method for manufacturing a semiconductor device for use in a memory cell including the steps of preparing an active matrix provided with at least one transistor, a plurality of conductive plugs electrically connected to the transistors and an insulating layer formed around the conductive plugs; patterning the insulating layer into a first predetermined configuration to form contact holes; forming a diffusion barrier layer on an entire surface including the contact holes; forming a seed layer on top of the diffusion barrier layer; forming a first conductive layer and a conductive plug on top of the seed layer; carrying out a thermal treatment for changing grains of the conductive plug into a granular type; removing the first conductive layer, the diffusion barrier layer, and the seed layer until a top surface of the insulating layer is exposed; forming a second conductive layer on the conductive plug and the diffusion barrier layer; patterning the second conductive layer into a second predetermined configuration to form a bottom electrode; and subsequently forming a dielectric layer and a third conductive layer on the bottom electrode and the insulating layer.

9 Claims, 4 Drawing Sheets

METHOD FOR MANUFACTURING SEMICONDUCTOR MEMORY DEVICE INCORPORATING THEREIN COPACITOR

FIELD OF THE INVENTION

The present invention relates to a semiconductor device; and, more particularly, to a method for forming a capacitor structure for inhibiting diffusion of oxygen atoms effectively by forming a conductive plug of platinum (Pt) under a bottom electrode.

DESCRIPTION OF THE PRIOR ART

As is well known, a dynamic random access memory (DRAM) with at least one memory cell comprised of a transistor and a capacitor has a higher degree of integration mainly due to downsizing through micronization. However, there is still a demand for downsizing the area of the memory cell.

To meet the demand, there have been proposed several structures for the capacitor, such as a concave type or a pedestal type capacitor, which are arranged three-dimensionally in a memory device to reduce the cell area available to the capacitor. However, the process of manufacturing a three-dimensionally arranged capacitor is a long and tedious one and consequently incurs high manufacturing costs. Therefore, there is a strong demand for a new memory device that can reduce the cell area while securing a requisite volume of information without requiring complex manufacturing steps.

To secure the capacitance in a given area, a high dielectric material, e.g., tantalum oxide ($Ta_2O_5$), barium strontium titanate (BST) or the like, has been used as a capacitor thin film in place of conventional silicon oxide film or silicon nitride film. And further, platinum (Pt), iridium (Ir), rhodium (Rh), ruthenium (Ru) or the like is employed as an electrode instead of conventional polysilicon.

Referring to FIG. 1, there is provided a cross sectional view of a conventional semiconductor device 100 with a pedestal type capacitor. The process for manufacturing the semiconductor device 100 begins with the preparation of an active matrix 110 including a silicon substrate 102, an isolation region 104, diffusion regions 106, gate oxides 108, gate lines 112, sidewalls 114, a bit line 118, polysilicon plugs 116, and an insulating layer 120. Here, the bit line 118 is electrically connected to one of the diffusion regions 106A to apply an electric potential. Each of the polysilicon plugs 116 is electrically connected to a respective one of the other diffusion regions 106. Although the bit line 118 actually lengthens in right and left directions bypassing the polysilicon plugs 116, the drawing does not show these parts of the bit line 118. Thereafter, a diffusion barrier layer and a first conductive layer are subsequently formed on top of the polysilicon plug 116 and then patterned into a predetermined configuration, thereby obtaining a diffusion barrier 122 and a bottom electrode 124. Finally, a high dielectric layer 126 and a second conductive layer 128 are formed sequentially on the entire surface.

In the conventional semiconductor device 100, the diffusion barrier layer 122 is formed between the polysilicon plug 116 and the bottom electrode 124 because oxygen atoms may diffuse into the polysilicon plug 116 along boundaries of the bottom electrode 124, which is made of Pt, Ir, Ru or the like, in a post thermal treatment with high temperature and oxygen rich ambient. Therefore, if there is no diffusion barrier layer 122 under the bottom electrode 124, the diffused oxygen atoms oxidize the polysilicon plug 116 to form a silicon oxide ($SiO_2$) film on a top surface of the polysilicon plug 116, eventually resulting in an open-circuit between the capacitor and the pass-gate transistor. In particular, when using Pt as the bottom electrode, the diffusion barrier layer 122 helps to prevent the formation of PtSi film due to Si inter-diffusion phenomenon between the polysilicon plug 116 and the bottom electrode 124. The diffusion barrier layer 122 can be made of titanium nitride such as TiN, (Ti,Al)N, (Ti,Si)N, or the like. But, this Ti nitride barrier layer has a limitation in that it is also oxidized above 600 ° C. in oxygen rich atmosphere. Thus, a low dielectric film such as $TiO_2$, $Al_2O_3$ or $SiO_2$ is formed on a surface of the diffusion barrier layer 122 so that the electrical path between the capacitor and the pass-gate transistor is open-circuited.

The phenomenon of oxygen diffusion through the Pt electrode is illustrated in more detail hereinafter. When the oxygen atoms under the bottom electrode diffuse along the boundaries of Pt and reach to a position ($X_{xo}$) in the Pt electrode at a temperature (T) for a predetermined time (t), the distance to the position ($X_{ox}$) can be described as a function of the temperature (T) and the time (t).

$$X_{ox} = k\sqrt{(dt)} \tag{Eq. 1}$$

Here, a constant D is the oxygen diffusion coefficient in Pt at the temperature (T), which is varied according to a grain type of Pt. From this equation, it is understood that if the distance ($X_{ox}$) is greater than the thickness of the Pt electrode, oxidization will occur. On the contrary, if the distance ($X_{ox}$) is less than the thickness of the Pt electrode, oxidization cannot occur.

Generally, the thickness of the Pt electrode formed by the conventional method is approximately 2,000 Å, when the grain type is a columnar type. Therefore, oxygen atoms may diffuse easily through the Pt electrode.

To overcome the above problem, various studies for inhibiting the oxygen diffusion have been carried out by using a hybrid electrode such as platinum/iridium (Pt/Ir), iridium oxide/iridium ($IrO_2$/Ir), Pt/$IrO_2$/Ir or platinum/ruthenium (Pt/Ru). But, the hybrid electrode has drawbacks in that it is expensive and further, difficult to fabricate, thereby decreasing productivity considerably.

SUMMARY OF THE INVENTION

It is, therefore, an object of the present invention to provide a semiconductor device incorporating a capacitor structure for effectively inhibiting diffusion of oxygen atoms by forming a conductive plug of platinum (Pt) under a bottom electrode.

In accordance with one aspect of the present invention, there is provided a method for manufacturing a semiconductor device for use in a memory cell, the method comprising steps of a) preparing an active matrix provided with at least one transistor, conductive plugs electrically connected to the transistor(s) and an insulating layer formed around the conductive plugs; b) patterning the insulating layer into a first predetermined configuration to form contact holes; c) forming a diffusion barrier layer on an entire surface including the contact holes; d) forming a seed layer on top of the diffusion barrier layer; e) forming a first conductive layer and a conductive plug on top of the seed layer; f) carrying out a thermal treatment for changing grains of the conductive plug into a granular type; g) removing the first conductive layer, the diffusion barrier layer and the seed layer until a top surface of the insulating layer is exposed; h) forming a second conductive layer on the conductive plug and the insulating layer; i) patterning the second conductive layer into a second predetermined configuration to form a bottom electrode; and j) forming a dielectric layer and then a third conductive layer on the bottom electrode and the insulating layer.

BRIEF DESCRIPTION OF THE PREFERRED EMBODIMENTS

The above and other objects and features of the present invention will become apparent from the following description of the preferred embodiments given in conjunction with the accompanying drawings, in which.

DETAILED DESCRIPTION OF THE PREFERRED EMBODIMENTS

There are provided in FIGS. 2A to 2F cross sectional views setting forth a method for manufacturing a semiconductor memory device incorporating a capacitor in accordance with a preferred embodiment of the present invention.

Figure 1:
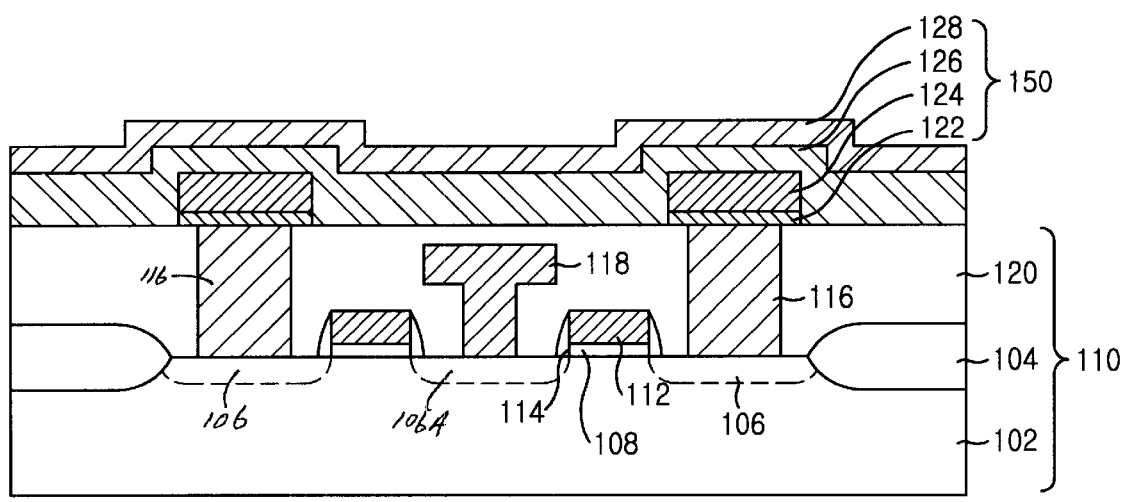
FIG. 1 is a schematic view of a conventional semiconductor memory device.
Figure 2A:
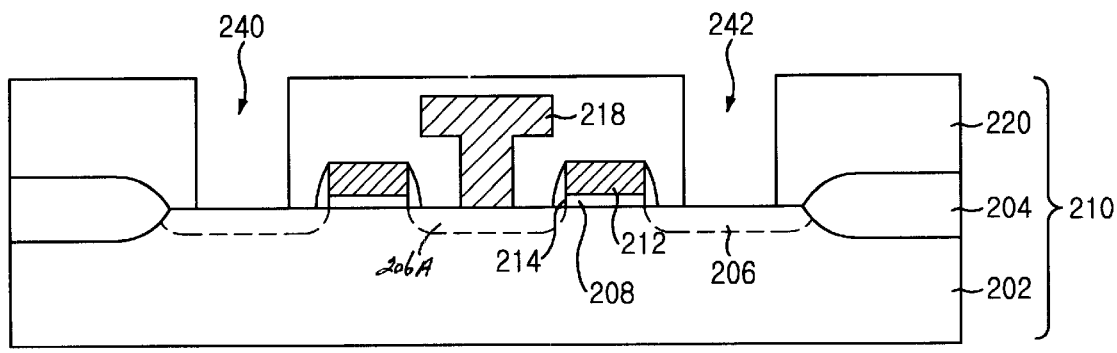
FIGS. 2A to 2F are schematic cross sectional views setting forth a method for the manufacture of the semiconductor memory device in accordance with the present invention.

The process for manufacturing the semiconductor device begins with the preparation of an active matrix 210 including a silicon substrate 202, an isolation region 204, diffusion regions 206, 206A, gate oxides 208, gate lines 212, a sidewall 214, a bit line 218, and an insulating layer 220, as shown in FIG. 2A. The insulating layer 220, which may be made of boron-phosphor-silicate glass (BPSG), is patterned into a predetermined configuration, thereby obtaining contact holes 240, 242. The bit line 218 is electrically connected to one of the diffusion regions 206A to apply an electric potential. Although the bit line 218 actually lengthens in right and left directions bypassing the contact holes 240, 242, the drawing does not show these parts of the contact holes 240, 242.

Figure 2B:
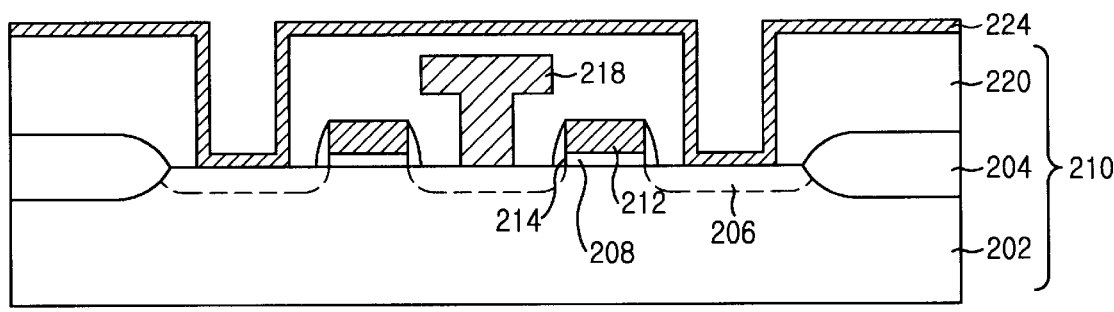

In a next step as shown in FIG. 2B, a diffusion barrier layer 224 is formed on an entire surface including the contact holes 240, 242 by using a method such as a chemical vapor deposition (CVD) technique or the like, with the diffusion barrier layer 224 being made of titanium/titanium nitride (Ti/TiN).

Figure 2C:
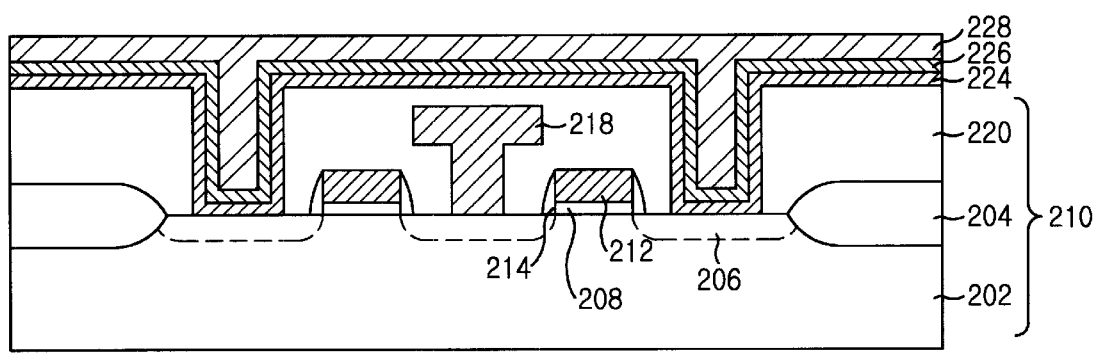
Figure 2D:
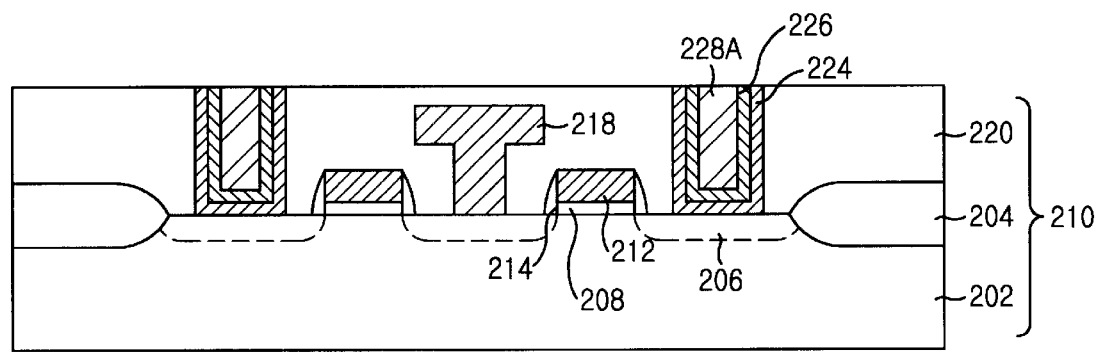

In an ensuing step, a seed layer 226 is formed on top of the diffusion barrier layer 224 and then, a first platinum (Pt) layer 228 is formed on top of the seed layer 226 by using a method such as an electro chemical deposition (ECD) technique as shown in FIG. 2C. Thereafter, a recrystallization process is carried out at a temperature ranging from 300° C. to 500° C., for changing columnar type grains of the first Pt layer 228 into granular grains. By carrying out the recrystallization process, it is possible to increase the diffusion distance of oxygen atoms along the boundaries of the first Pt layer 228 due to the granular type of grains.

In a subsequent step as shown 2D, the first Pt layer 228, the diffusion barrier layer 224 and the seed layer 226 are removed until a top surface of the insulating layer 220 is exposed, by using an etch-back process or a chemical mechanical polishing (CMP), thereby obtaining a Pt conductive plug 228A. In the embodiment, the depth of the Pt conductive plug is at least approximately 12,000 Å.

Figure 2E:
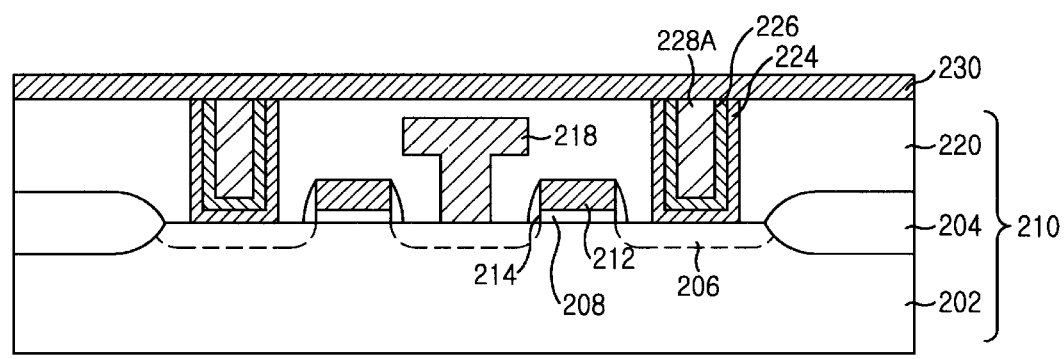

Thereafter, a second conductive layer 230 such as Pt, iridium (Ir), or ruthenium (Ru), is formed on top of the Pt conductive plug 228A and the insulating layer 220 by sputtering or a metal-organic chemical vapor deposition (MOCVD) technique as shown in FIG. 2E. Forming the Pt conductive plug 228A with a sufficient thickness makes it very difficult for the oxygen atoms to diffuse through the Pt conductive plug 228A.

Figure 2F:
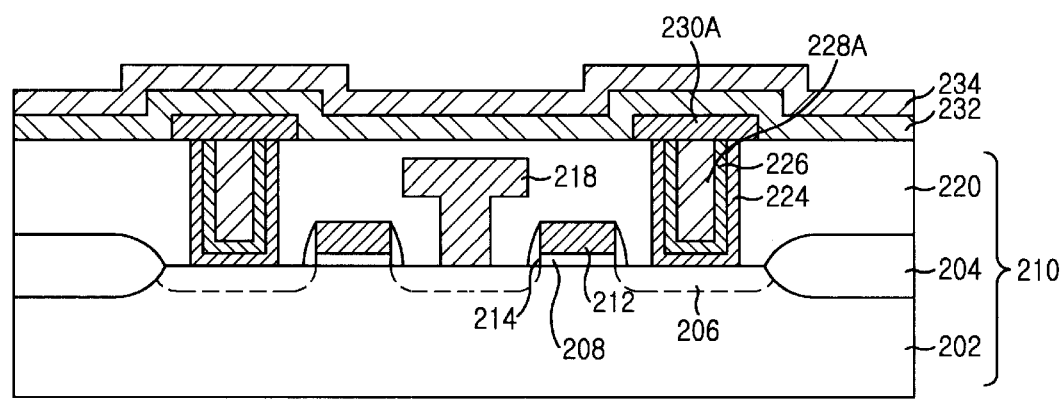

In a next step as shown in FIG. 2F, the second conductive layer 230 is patterned into a second predetermined configuration, thereby obtaining a bottom electrode 230A. A dielectric layer 232 and third conductive layer 234 are then formed on the entire surface. The dielectric layer 232 can be made of a material such as a high dielectric material of tantalum oxide ($Ta_2O_5$) or barium strontium titanate (BST) and a ferroelectric material of strontium bismuth tantalate (SBT) or lead zirconate titanate (PZT). After depositing the dielectric layer 232, an annealing process is carried out at a temperature ranging from 650° C. to 800° C. in oxygen rich ambient for densification or crystallization of the dielectric layer 232. In addition, the third conductive layer 234 can be made of a material such as Pt, iridium (Ir), ruthenium (Ru) or the like.

In the present invention, since the contact plug is made of Pt which is also applied to the bottom electrode, it is possible to lengthen the diffusion distance of oxygen atoms to the diffusion barrier layer during the post thermal treatment in a oxygen ambient. Furthermore, to prevent the oxygen atoms from diffusing along the boundaries of the Pt, the grain structure of the Pt is changed from a columnar type into the granular type so that diffusion of the oxygen atoms along the boundaries of the Pt is minimized.

While the present invention has been described with respect to the particular embodiments, it will be apparent to those skilled in the art that various changes and modifications may be made without departing from the scope of the invention as defined in the following claims.

What is claimed is:

1. A method for manufacturing a semiconductor device for use in a memory cell, the method comprising steps of:
  a) preparing an active matrix provided with at least one transistor, at least one conductive plug electrically connected to each transistor and an insulating layer formed around the conductive plug;
  b) patterning the insulating layer into a first predetermined configuration to form contact holes;
  c) forming a diffusion barrier layer on an entire surface including the contact holes;
  d) forming a seed layer on top of the diffusion barrier layer;
  e) forming a first conductive layer on top of the seed layer, said first conductive layer forming a conductive plug;
  f) carrying out a thermal treatment for changing grains of the conductive plug into a granular type;
  g) removing the first conductive layer, the diffusion barrier layer and the seed layer until a top surface of the insulating layer is exposed;
  h) forming a second conductive layer on the conductive plug and the insulating layer;
  i) patterning the second conductive layer into a second predetermined configuration to form a bottom electrode; and
  j) forming a dielectric layer and a third conductive layer on the bottom electrode and the insulating layer, subsequently.

2. The method as recited in claim 1, wherein the first conductive layer and the conductive plug is made of a material selected from the group consisting of platinum (Pt), iridium (Ir) and ruthenium (Ru).

3. The method as recited in claim 1, wherein the second conductive layer is made of Pt.

4. The method as recited in claim 1, wherein the third conductive layer is made of a material selected from the group consisting of Pt, Ir and Ru.

5. The method as recited in claim 1, wherein the step e) is carried out by an electric chemical deposition (ECD) technique.

6. The method as recited in claim 1, wherein the step f) is carried out at a temperature ranging from 300° C. to 500° C.

7. The method as recited in claim 1, wherein the step g) is carried out by a dry etch-back process or a chemical mechanical polishing (CMP) process.

8. The method as recited in claim 1, wherein the dielectric layer is made of a material selected from the group consisting of tantalum oxide ($Ta_2O_5$), barium strontium titanate (BST), strontium bismuth tantalate (SBT) and lead zirconate titanate (PZT).

9. The method as recited in claim 1, wherein the second and the third conductive layers are formed by sputtering method or metal-organic chemical vapor deposition (MOCVD) method.

* * * * *